US012567844B2

(12) United States Patent
Peting

(10) Patent No.: US 12,567,844 B2
(45) Date of Patent: Mar. 3, 2026

(54) CLASS D AMPLIFIER WITH STABILIZED PWM CONTROL LOOP

(71) Applicant: SKYWORKS SOLUTIONS, INC., Irvine, CA (US)

(72) Inventor: Mark R. Peting, Yamhill, OR (US)

(73) Assignee: SKYWORKS SOLUTIONS, INC., Irvine, CA (US)

(*) Notice: Subject to any disclaimer, the term of this patent is extended or adjusted under 35 U.S.C. 154(b) by 692 days.

(21) Appl. No.: 17/955,638

(22) Filed: Sep. 29, 2022

(65) Prior Publication Data

US 2023/0101927 A1 Mar. 30, 2023

Related U.S. Application Data

(60) Provisional application No. 63/250,737, filed on Sep. 30, 2021.

(51) Int. Cl.
*H03F 3/217* (2006.01)
*H03M 1/46* (2006.01)

(52) U.S. Cl.
CPC ............ *H03F 3/217* (2013.01); *H03M 1/462* (2013.01); *H03F 2200/351* (2013.01)

(58) Field of Classification Search
CPC ............... H03F 3/217; H03F 2200/351; H03F 2200/03; H03F 3/183; H03F 3/2173; H03F 3/2175; H03F 3/68; H03F 3/2171; H03M 1/462
USPC ......................................... 330/10, 207 P, 251
See application file for complete search history.

(56) References Cited

U.S. PATENT DOCUMENTS

| | | | |
|---|---|---|---|
| 5,777,512 A | 7/1998 | Tripathi et al. | |
| 6,998,910 B2 | 2/2006 | Hezar et al. | |
| 7,058,464 B2 | 6/2006 | Mallinson | |
| 7,200,187 B2 | 4/2007 | O'Brien | |
| 7,649,958 B2 | 1/2010 | Macphail et al. | |
| 8,416,017 B2* | 4/2013 | Kohut ................... | H03F 3/2173 330/10 |
| 9,768,799 B1 | 9/2017 | Yoo et al. | |
| 9,859,855 B2* | 1/2018 | Kinyua .................. | H05M 1/12 |
| 11,250,830 B2 | 2/2022 | Wurtz | |
| 2015/0155836 A1 | 6/2015 | Midya et al. | |
| 2016/0308577 A1 | 10/2016 | Molina et al. | |
| 2017/0294888 A1 | 10/2017 | Berkhout et al. | |
| 2019/0007010 A1 | 1/2019 | Høyerby | |
| 2020/0228076 A1 | 7/2020 | Lee | |
| 2021/0203287 A1 | 7/2021 | Kinyua et al. | |

(Continued)

*Primary Examiner* — Khanh V Nguyen
(74) *Attorney, Agent, or Firm* — Lando & Anastasi, LLP

(57) ABSTRACT

A class D amplifier including a pulse width modulation (PWM) control loop, an H-bridge driver, a PWM controller having a PWM pulse generator to generate PWM pulses supplied to the H-bridge driver in response to an ADC value output by an analog-to-digital converter of the PWM control loop, and a comparator. The comparator is configured to trigger a cutoff of a PWM pulse generated by the PWM pulse generator during a respective loop cycle of the PWM control loop and to trigger generation of at least one counter PWM pulse with an opposite polarity in the respective loop cycle such that a net pulse energy of the cutoff PWM pulse and of the at least one generated counter PWM pulse corresponds to a pulse energy representing the ADC value provided by the analog-to-digital converter of the PWM control loop during the respective loop cycle.

20 Claims, 6 Drawing Sheets

(56) References Cited

U.S. PATENT DOCUMENTS

| | | |
|---|---|---|
| 2022/0308613 A1 | 9/2022 | Zanbaghi et al. |
| 2022/0345149 A1 | 10/2022 | Bal et al. |
| 2023/0058434 A1 | 2/2023 | Yang et al. |
| 2023/0097106 A1 | 3/2023 | Peting et al. |
| 2023/0247354 A1 | 8/2023 | Sakai |
| 2024/0030930 A1 | 1/2024 | Lee |
| 2024/0388304 A1 | 11/2024 | Lee |

* cited by examiner

CLASS D AMPLIFIER WITH STABILIZED PWM CONTROL LOOP

CROSS-REFERENCE TO RELATED APPLICATIONS

This application claims priority under 35 U.S.C. § 119(e) to U.S. Provisional Patent Application Ser. No. 63/250,737, titled "CLASS D AMPLIFIER WITH STABILIZED PWM CONTROL LOOP," filed Sep. 30, 2021, the entire contents of which is incorporated herein by reference for all purposes.

BACKGROUND

Field

Embodiments of the invention relate to audio systems and in particular to a class D amplifier with a stabilized PWM control loop.

Description of the Related Technology

Class D amplifiers are widely used in acoustic systems. Class D amplifiers provide a high power efficiency when compared to other audio amplifier classes such as class A, B and AB audio amplifiers. Transistors of a class D amplifier are used as switches to steer electrical current through a connected load resulting in minimal power losses.

SUMMARY

According to an aspect of the present disclosure, a class D amplifier is provided. The class D amplifier comprises a pulse width modulation (PWM) control loop, an H-bridge driver, a PWM controller having a PWM pulse generator to generate PWM pulses supplied to the H-bridge driver in response to an ADC value output by an analog-to-digital converter of the PWM control loop, and a comparator. The comparator is configured to trigger a cutoff of a PWM pulse generated by the PWM pulse generator of the PWM controller during a respective loop cycle of the PWM control loop and to trigger generation of at least one counter PWM pulse with an opposite polarity in the respective loop cycle such that a net pulse energy of the cutoff PWM pulse and of the at least one generated counter PWM pulse corresponds to a pulse energy representing the ADC value provided by the analog-to-digital converter of the PWM control loop during the respective loop cycle.

According to one example, the comparator is integrated in the PWM controller of the PWM control loop. In another example, the PWM control loop includes a loop filter to integrate an error between an input voltage which corresponds to an input audio signal and a voltage across a loudspeaker connected to the H-bridge driver of the class D amplifier.

In another example, the analog-to-digital converter digitizes the integrated error every loop cycle of the PWM control loop of the class D amplifier to provide the ADC value output to the PWM controller. In accordance with this example, the PWM pulse generator generates PWM pulses supplied to the H-bridge driver of the class D amplifier in a normal operation mode in response to the digitized integrated error values received as ADC values from the analog-to-digital converter.

In an example, the loop filter include an analog low-pass filter.

In another example the analog-to-digital converter supplies a digitized integrated error value as an ADC value every sample period of a digital input of the PWM controller.

In another example, the PWM controller includes a supply voltage monitoring and prediction circuit adapted to maintain a target voltage.

In another example, the PWM controller includes a common mode control circuit adapted to maintain a setpoint common mode voltage. In a further example, the H-bridge driver includes a positive H-bridge driver circuit having a positive output terminal and a negative H-bridge driver circuit having a negative output terminal. In accordance with this example, a loudspeaker is connected to the positive output terminal and to the negative output terminal of the H-bridge driver of the class D amplifier.

In an example, the PWM pulse generator of the PWM controller supplies a first gray-coded output value to a positive H-bridge driver circuit of the H-bridge driver and a second gray-coded output value to a negative H-bridge driver circuit of the H-bridge driver of the class D amplifier.

In an example, the digitized integrated error value supplied by the analog-to-digital converter to the digital input of the PWM controller comprises an ADC value with an offset binary format.

In another example, the analog-to-digital converter comprises a SAR analog-to-digital converter.

According to another aspect of the present invention, a method for stabilizing a PWM control loop is provided. The method comprises cutting off a PWM pulse generated by a PWM pulse generator of a PWM controller during a respective loop cycle of the PWM control loop, and generating at least one counter PWM pulse with an opposite polarity in the respective loop cycle such that the net pulse energy of the cutoff PWM pulse and of the at least one generated counter PWM pulse corresponds to a pulse energy representing an ADC value output by an analog-to-digital converter of the PWM control loop during the respective loop cycle.

In one example the method further comprises comparing a pulse energy of a PWM pulse representing an ADC value output by the analog-to-digital converter of the PWM control loop during the respective loop cycle of the PWM control loop with a pulse energy of a PWM pulse generated by a PWM pulse generator of the PWM controller of the PWM control loop during the respective loop cycle, and cutting off the PWM pulse generated by the PWM pulse generator of the PWM controller during the respective loop cycle and generating the at least one counter PWM pulse with an opposite polarity in the respective loop cycle such that the net pulse energy comprising the pulse energy of the cutoff PWM pulse and comprising the pulse energy of the at least one generated counter PWM pulse corresponds to a pulse energy representing the ADC value output by the analog-to-digital converter during the respective loop cycle if the pulse energy of the PWM pulse generated by the PWM pulse generator during the respective loop cycle exceeds the pulse energy of the PWM pulse representing the ADC value output by the analog-to-digital converter during the respective loop cycle. In another example, an amplitude of the counter PWM pulse is a multiple of the amplitude of the generated PWM pulse.

According to another aspect of the present disclosure, an audio processing device comprising a class D amplifier is provided. The class D amplifier comprises a pulse width modulation (PWM) control loop including an analog-to-digital converter, an H-bridge driver, a PWM controller, and a comparator. The PWM controller includes a PWM pulse generator to generate PWM pulses supplied to the H-bridge driver in response to an ADC value output by the analog-to-digital converter of the PWM control loop. The comparator triggers a cutoff of a PWM pulse generated by the PWM pulse generator of the PWM controller during a respective loop cycle of the PWM control loop and triggers the generation of at least one counter PWM pulse with an opposite polarity in the respective loop cycle such that the net pulse energy of the cutoff PWM pulse and of the at least one generated counter PWM pulse corresponds to a pulse energy representing the ADC value provided by the analog-to-digital converter of the PWM control loop during the respective loop cycle.

In one example, the comparator is integrated in the PWM controller of the PWM control loop.

In another example, the PWM control loop includes a loop filter to integrate an error between an input voltage which corresponds to an input audio signal and a voltage across a loudspeaker connected to the H-bridge driver of the class D amplifier. In accordance with this example, the analog-to-digital converter digitizes the integrated error every loop cycle of the PWM control loop of the class D amplifier to provide the ADC value output to the PWM controller. In a further example, the PWM pulse generator generates PWM pulses supplied to the H-bridge driver of the class D amplifier in a normal operation mode in response to the digitized integrated error values received as ADC values from the analog-to-digital converter.

In one example, the loop filter includes an analog low-pass filter. In another example, the analog-to-digital converter supplies a digitized integrated error value as an ADC value every sample period of a digital input of the PWM controller. In another example, the PWM controller includes a supply voltage monitoring and prediction circuit adapted to maintain a target voltage. In another example, the PWM controller includes a common mode control circuit adapted to maintain a setpoint common mode voltage. In a further example, the H-bridge driver includes a positive H-bridge driver circuit having a positive output terminal and a negative H-bridge driver circuit having a negative output terminal. In a still further example, a loudspeaker is connected to the positive output terminal and to the negative output terminal of the H-bridge driver of said class D amplifier.

In accordance with an example, the PWM pulse generator of the PWM controller supplies a first gray-coded output value to a positive H-bridge driver circuit of the H-bridge driver and a second gray-coded output value to a negative H-bridge driver circuit of the H-bridge driver of the class D amplifier.

In another example the digitized integrated error value supplied by the analog-to-digital converter to the digital input of the PWM controller comprises an ADC value with an offset binary format.

In a further example, the analog-to-digital converter includes a SAR analog-to-digital converter.

In accordance with a further aspect of the present disclosure, a wireless device that include an audio processing device with a class D amplifier is provided. The class D amplifier comprises a pulse width modulation (PWM) control loop including an analog-to-digital converter, an H-bridge driver, a PWM controller including a PWM pulse generator to generate in response to an ADC value output by the analog-to-digital converter of the PWM control loop PWM pulses supplied to the H-bridge driver, and a comparator. The comparator triggers a cutoff of a PWM pulse generated by the PWM pulse generator of the PWM controller during a respective loop cycle of the PWM control loop and triggers the generation of at least one counter PWM pulse with an opposite polarity in the respective loop cycle such that the net pulse energy of the cutoff PWM pulse and of the at least one generated counter PWM pulse corresponds to a pulse energy representing the ADC value by the analog-to-digital converter of the PWM control loop during the respective loop cycle. In accordance with one example, the wireless device further includes a loudspeaker connected to the H-bridge driver of the class D amplifier.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
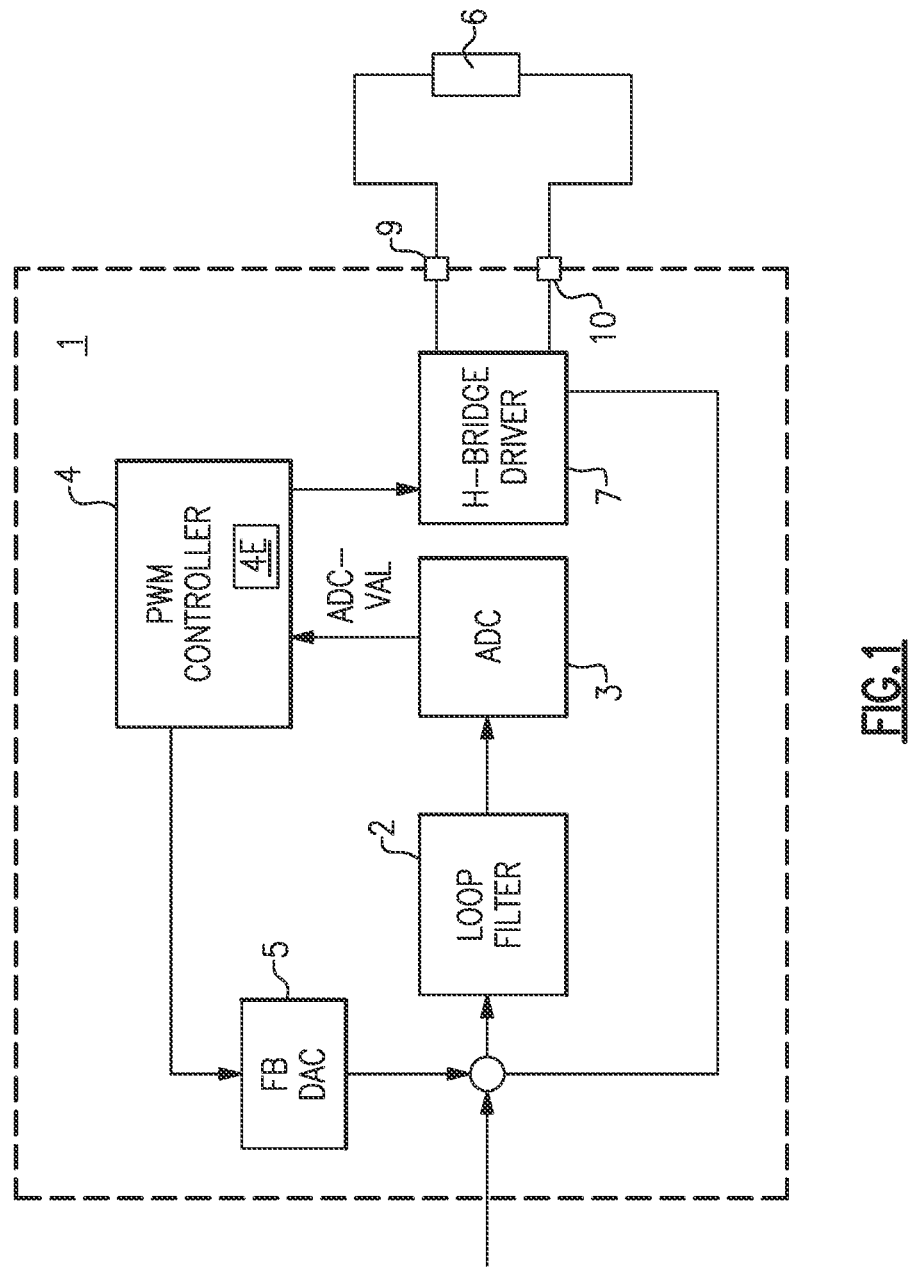
FIG. 1 is a schematic block diagram illustrating a class D amplifier according to an embodiment.

The following detailed description of certain embodiments presents various descriptions of specific embodiments. However, the innovations described herein can be embodied in a multiple of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or in a subset of the elements illustrated in a drawing. Further, some embodiments can incorporate any suitable combination of features from two or more drawings.

FIG. 1 shows a schematic block diagram of an embodiment of a class D amplifier 1 with a stabilized PWM control loop. As can be seen in FIG. 1, the PWM control loop includes a loop filter 2, an analog-to-digital converter (ADC) 3, a PWM controller 4 and a feedback (FB) digital-to-analog converter (DAC) 5. The feedback digital-to-analog converter (DAC) 5 is used in a startup mode of the amplifier and may be turned off during normal operation. The loop filter 2 of the PWM control loop is adapted to integrate an error between an input voltage which corresponds to an input audio signal and a voltage across a loudspeaker 6 connected to an H-bridge driver 7 of the class D amplifier 1.

The loop filter 2 of the PWM control loop can include an analog low-pass filter. The output of the loop filter 2 is connected to the input of the analog-to-digital converter (ADC) 3. The analog-to-digital converter (ADC) 3 of the PWM control loop of the class D amplifier 1 is adapted to digitize the integrated error provided by the loop filter 2 every loop cycle (LC) of the PWM control loop and to provide a digitized integrated error value as an ADC value or ADC code applied to a digital input of the PWM controller 4 of the PWM control loop of the class D amplifier 1 as shown in FIG. 1.

Figure 3:
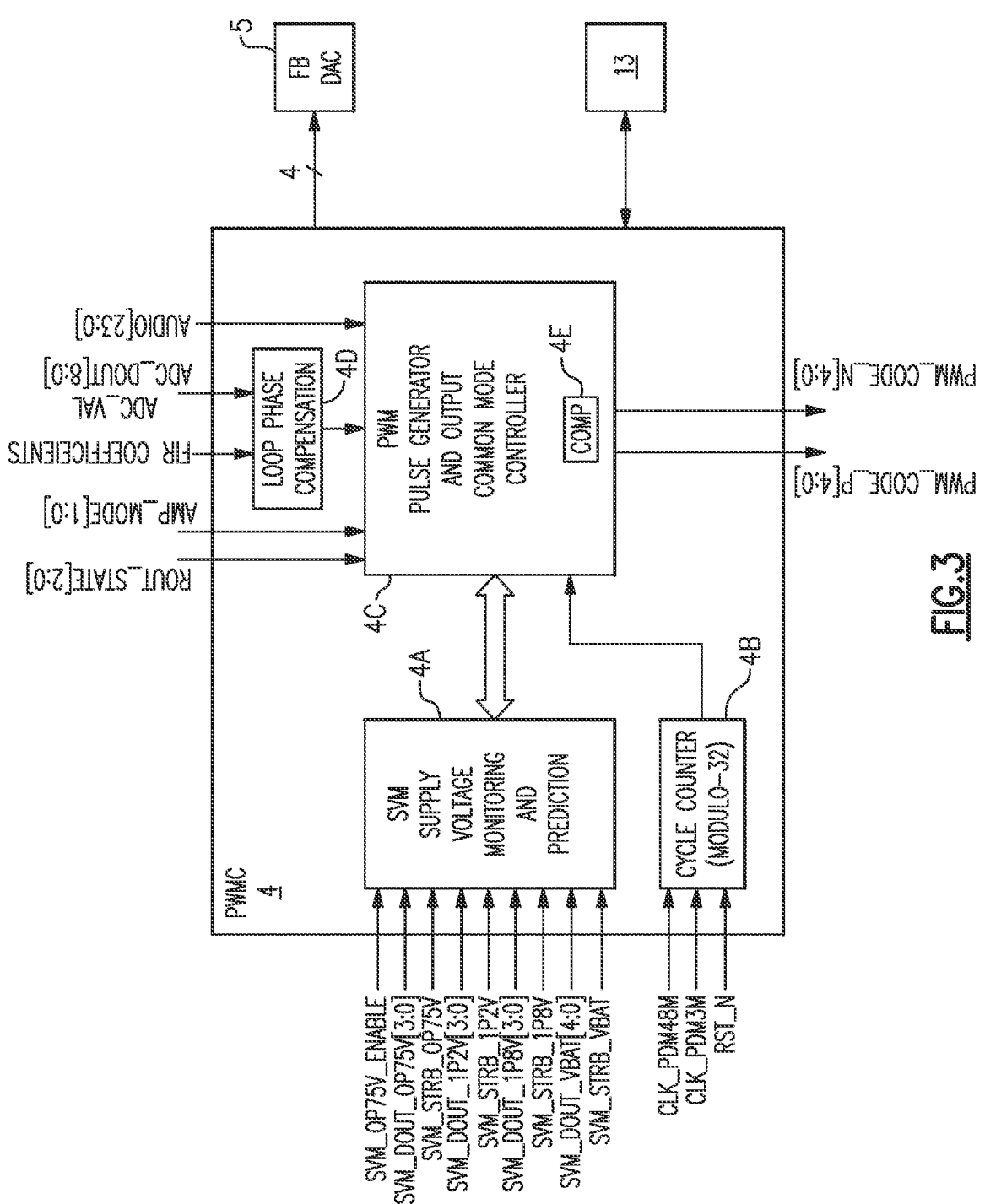
FIG. 3 is a block diagram of a PWM controller of a class D amplifier.

The PWM controller 4 includes a PWM pulse generator 4C as illustrated in FIG. 3. In a normal operation mode of the class D amplifier 1, the PWM pulse generator 4C of the PWM controller 4 is adapted to generate PWM pulses supplied to the H-bridge driver 7 of the class D amplifier 1 in response to the digitized integrated error values received from the analog-to-digital converter 3 as ADC output values.

Figure 2:
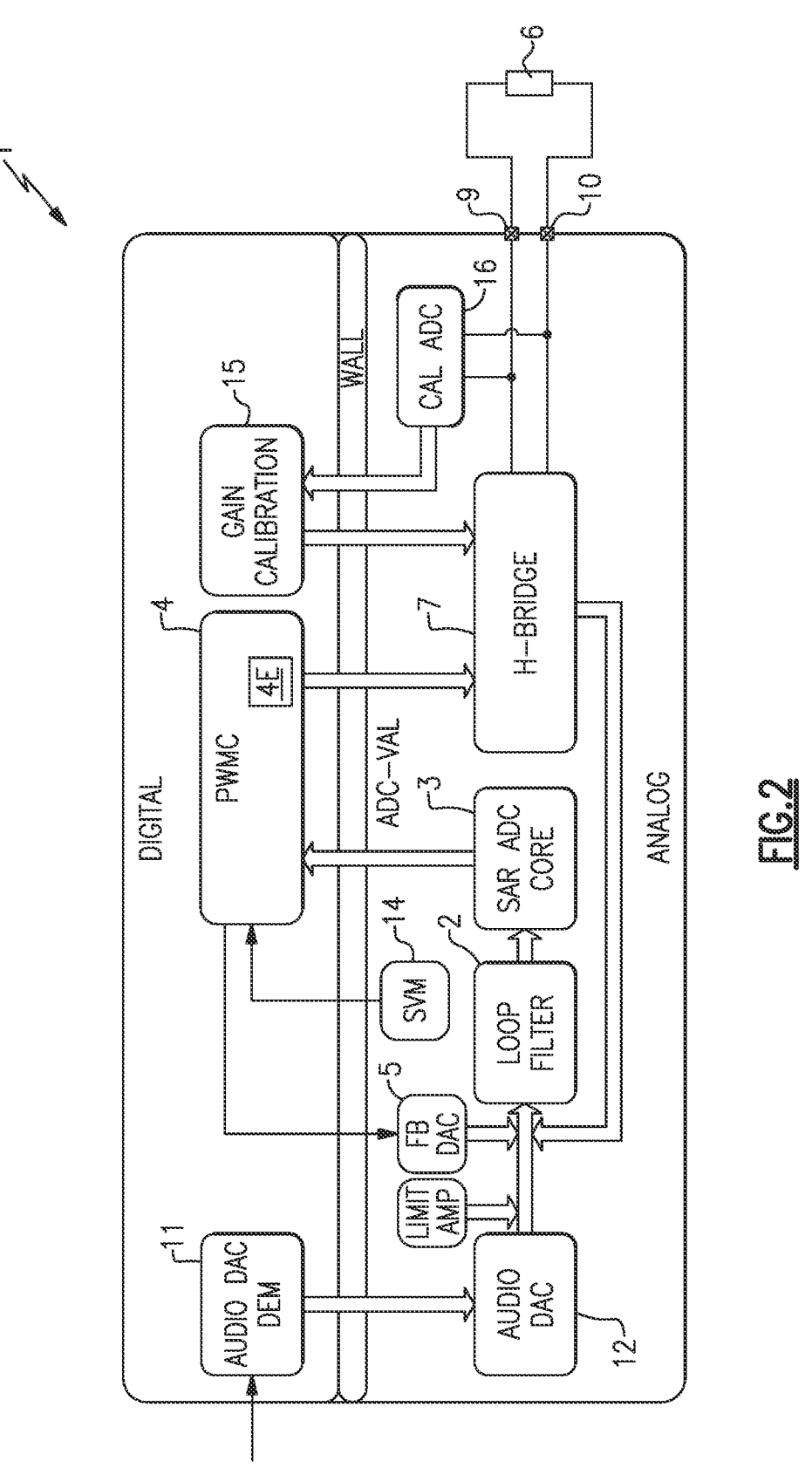
FIG. 2 is a further schematic block diagram illustrating a class D amplifier according to an embodiment.

In one embodiment, the analog-to-digital converter (ADC) 3 within the PWM control loop of the class D amplifier 1 can include a successive approximation register (SAR) analog-to-digital converter 3. Other types of analog-to-digital converters can be used as well. The successive approximation register (SAR) analog-to-digital converter 3 as shown in FIG. 2 is adapted to convert a continuous analog waveform into a discrete digital representation using a binary search through all possible quantization levels before finally converging upon a digital output. The analog-to-digital converter 3 is adapted to supply a digital ADC value to a digital input of the PWM controller 4 every sample period.

The H-bridge driver 7 of the class D amplifier 1 can include a positive H-bridge driver circuit connected to the positive output terminal 9 and a negative H-bridge driver circuit connected to the negative output terminal 10. The PWM pulse generator 4C integrated in the PWM controller 4 can be adapted to supply a first gray-coded output value to the positive H-bridge driver circuit of the H-bridge driver 7 and a second gray-coded output value to the negative H-bridge driver circuit of the H-bridge driver 7.

FIG. 2 shows a block diagram for illustrating an exemplary embodiment of the class D amplifier 1. In the illustrated circuit of FIG. 2, an error between a desired audio level as set by the input audio stream and the actual input voltage across the loudspeaker 6 is integrated by the loop filter 2 of the PWM control loop. This integrated error is digitized by the SAR analog-to-digital converter 3 and supplied to the digital input of the PWM controller 4 in order to generate a differential pulse on one of a set of possible supply voltages. The PWM controller 4 is provided for optimally generating the necessary pulse given the received analog-to-digital converter sampled value and available supply voltages.

The PWM controller 4 can include a supply voltage monitoring (SVM) and prediction circuit 4A as shown in FIG. 3 adapted to maintain a target voltage. The PWM controller 4 can further include a common mode control circuit adapted to maintain a set point common mode voltage. The PWM controller 4 is provided to maintain a desired output current mode voltage as calculated and supplied by the common mode control circuit. The PWM controller 4 can generate a PWM pulse in response to a received ADC output value as provided by the analog-to-digital converter (ADC) 3 every loop cycle of the PWM control loop. In one embodiment, a differential pulse is created on both positive and negative edges to allow in a possible implementation 32 possible pulse widths. One of several supply voltages can be selected to maintain a target voltage while optimizing for power efficiency.

In the illustrated embodiment of FIG. 2, a digital audio signal can be supplied to an audio DAC DEM (dynamic element matching) block 11 on a digital side of the circuit. The digital side of the circuit is separated by a wall of level shifters from an analog side of the circuit having an audio DAC 12 as shown in FIG. 1. An output of the audio DAC 12 is connected to the input of the analog loop filter 2 of the PWM control loop as illustrated in FIG. 2. In the illustrated embodiment of FIG. 2, the supply voltage monitor (SVM) unit 14 is also connected to the PWM controller 4. Further, the circuit illustrated in FIG. 2 can include a gain calibration block 15 connected to an analog-to-digital converter 16 at the output of the H-bridge driver 7.

FIG. 3 shows a functional block diagram of a PWM controller 4 of the class D amplifier 1. In the illustrated embodiment, the PWM controller 4 includes a PWM pulse generator 4C including a comparator 4E. The PWM pulse generator 4C is adapted to generate PWM pulses provided by the PWM controller 4 to the H-bridge driver 7 of the class D amplifier 1 in response to an ADC value output by the analog-to-digital converter 3 of the PWM control loop. The comparator 4E of the PWM pulse generator 4C is adapted to trigger a cutoff of the PWM pulse generated by the PWM pulse generator 4C during a loop cycle of the PWM control loop and to trigger the generation of at least one counter PWM pulse with an opposite polarity in the same loop cycle such that the net pulse energy of the cutoff PWM pulse and the at least one generated counter PWM pulse matches a pulse energy representing the ADC value output by the analog-to-digital converter 3 of the PWM control loop during the respective loop cycle. In the embodiment illustrated in FIG. 3, the comparator 4E is integrated in the PWM pulse generator 4C of the PWM controller 4.

In the illustrated embodiment of FIG. 3, the PWM controller 4 further includes a loop phase compensation circuit 4D receiving FIR coefficients. The output of the loop phase compensation circuit 4D is connected to the PWM pulse generator and output common mode controller 4C of the PWM controller 4. The PWM pulse generator and output common mode controller 4C generates in the illustrated implementation gray-coded output values supplied to the H-bridge driver 7.

In the illustrated embodiment, the pulse generator and output common mode controller 4C can generate a 5-bit gray-coded output value for the positive H-bridge driver circuit and a 5-bit gray-coded output value for the negative H-bridge driver circuit. The loop phase compensation circuit 4D receives in the shown embodiment a 9-bit SAR ADC value from the SAR analog-to-digital converter 3 of the PWM control loop. The SAR ADC output value can be updated in a possible implementation every 3 MHz sample period. The format of the SAR ADC code can be offset binary. The bits can arrive MSB first with a delay of less than 6 ns between the bits. In the illustrated embodiment of FIG. 3, the PWM controller 4 can also receive an ROUT_STATE for setting a high output resistance (HOR) mode or a zero output resistance (ZOR) mode.

Further, the PWM controller 4 can receive an amplification mode control signal AMP MODE as illustrated in FIG. 3. An inductance of the speaker driver of the loudspeaker 6 can result in a difference in a loop response between the high output resistance (HOR) mode and the zero output resistance (ZOR) mode. This difference can be significant at a high frequency, e.g., at 200 kHz, and is pertinent for a loop stability.

The loop phase compensation circuit 4D is provided to reduce the difference in this loop response between the output resistance modes. The PWM pulse generator and output common mode controller 4C can receive a signal from a cycle counter of (modulo 32) 4B as shown in FIG. 3.

As illustrated in FIG. 3, the PWM controller 4 can in certain embodiments be connected to a control block 13 which can be used to control a startup and/or a shutdown sequence of the class D amplifier 1. The PWM pulse generator and output common mode controller 4C can be adapted in a startup sequence to control the feedback digital-to-analog converter 5 according to the digitized integrated values to supply PWM pulses to the loop filter 2 of the PWM control loop and to control the H-bridge driver 7 to generate a fixed PWM pulse pattern. An alignment detector can be integrated in the PWM controller 4 to detect a phase alignment between the fixed PWM pulse pattern provided by the H-bridge driver 7 and the PWM pulses provided by the feedback digital-to-analog converter 5 to control a seamless transition from a startup operation mode to a closed loop operation of the PWM control loop in a normal operation mode with a reduced acoustic startup noise.

The PWM control loop of the class D amplifier 1 has an analog-to-digital converter 3 which digitizes the output of the loop filter 2. The output value of the analog-to-digital converter 3 is not available until part of the PWM loop cycle has elapsed. Consequently, to generate a PWM pulse of a high-duty cycle, the PWM pulse starts before the ADC output value is available to the PWM controller 4. This requires that a start time is predicted based on previous samples. If the prediction is too early in cases where too much energy is put out, this does reduce the loop stability of the PWM control loop. In contrast, if the prediction is too late, then insufficient energy can reduce the stability of the PWM control loop.

For stabilizing the PWM control loop, the comparator 4E integrated in the PWM controller 4 can compare a pulse energy of a PWM pulse representing the ADC value output by the analog-to-digital converter 3 of the PWM control loop during a loop cycle of the PWM control loop with a pulse energy of a PWM pulse generated by the PWM pulse generator 4C of the PWM controller 4 during the same loop cycle. The comparator 4E is adapted to trigger a cutting off of the PWM pulse generated by the PWM pulse generator 4C during a loop cycle of the PWM control loop and to trigger the generation of at least one counter PWM pulse with an opposite polarity in the respective loop cycle such that the net pulse energy of the cutoff PWM pulse and of the at least one generated counter PWM pulse does correspond to a pulse energy representing the ADC value output by the analog-to-digital converter 3 of the PWM control loop during the same loop cycle LC.

Figure 4:
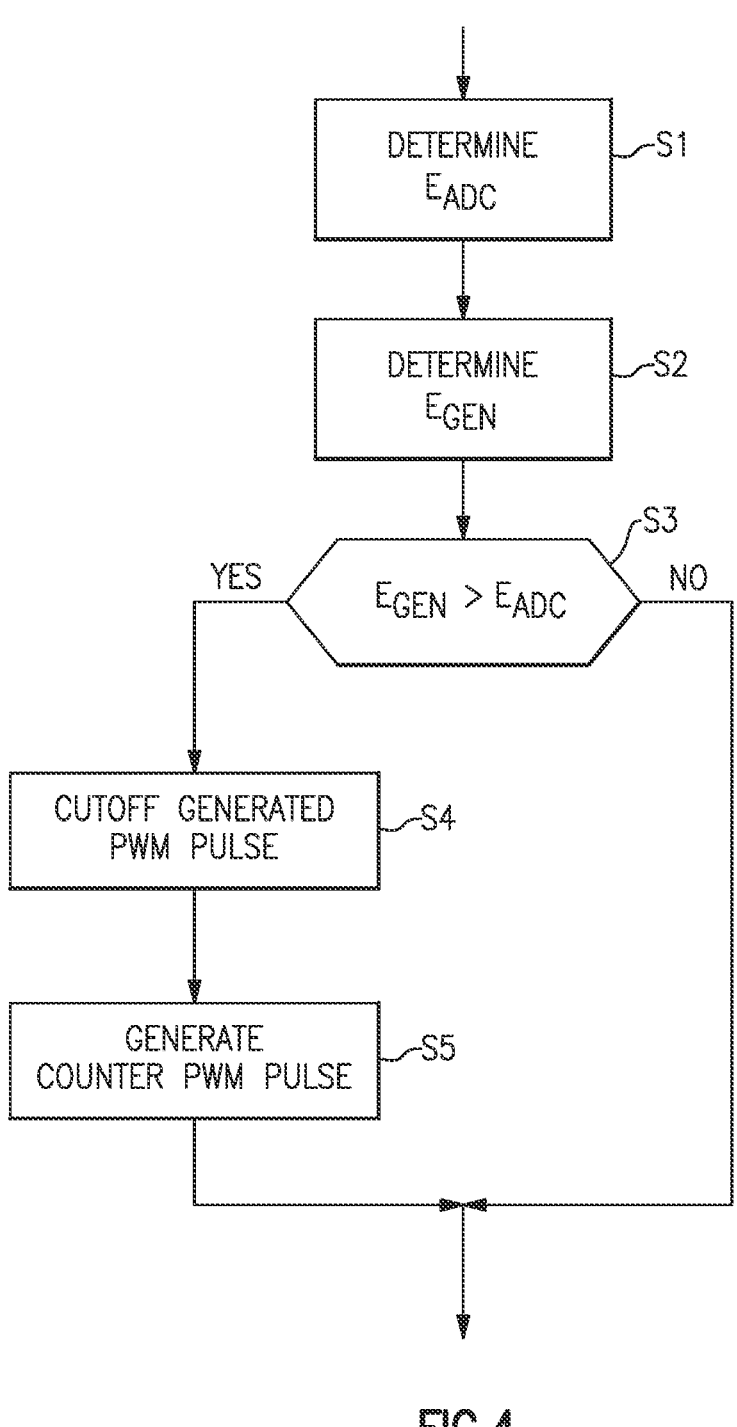
FIG. 4 is a flowchart for illustrating an embodiment of a method for stabilizing of a PWM control loop.

FIG. 4 shows a flowchart for illustrating an exemplary embodiment of a method for stabilizing of a PWM control loop within a class D amplifier 1.

In a first step S1, a pulse energy of a PWM pulse representing an ADC value output by the analog-to-digital converter 3 of the PWM control loop during a loop cycle LC is determined.

In a further step S2, the pulse energy of a PWM pulse generated by the PWM pulse generator 4C of the PWM controller 4 is determined for the same loop cycle LC.

In a further step S3, the pulse energy of the PWM pulse generated by the PWM pulse generator 4C during the loop cycle LC is compared with the pulse energy of the PWM pulse representing the ADC value output by the analog-to-digital converter 3 during the same respective loop cycle LC.

In the event that the pulse energy of the PWM pulse generated by the PWM pulse generator during the loop cycle exceeds the pulse energy of the PWM pulse representing the ADC value output by the analog-to-digital converter 3 during the loop cycle, the comparator 4E can trigger a cutoff of the generated PWM pulse in step S4 and the generation of at least one counter PWM pulse in step S5.

The PWM pulse generated by the PWM pulse generator 4C is cutoff in step S4 and at least one counter PWM pulse is generated in step S5 with an opposite polarity such that the net pulse energy comprising the pulse energy of the cutoff PWM pulse and comprising the pulse energy of the at least one generated counter PWM pulse corresponds to the pulse energy representing the ADC value output by the analog-to-digital converter 3 of the PWM control loop during the respective loop cycle LC.

Figures 5, 6:
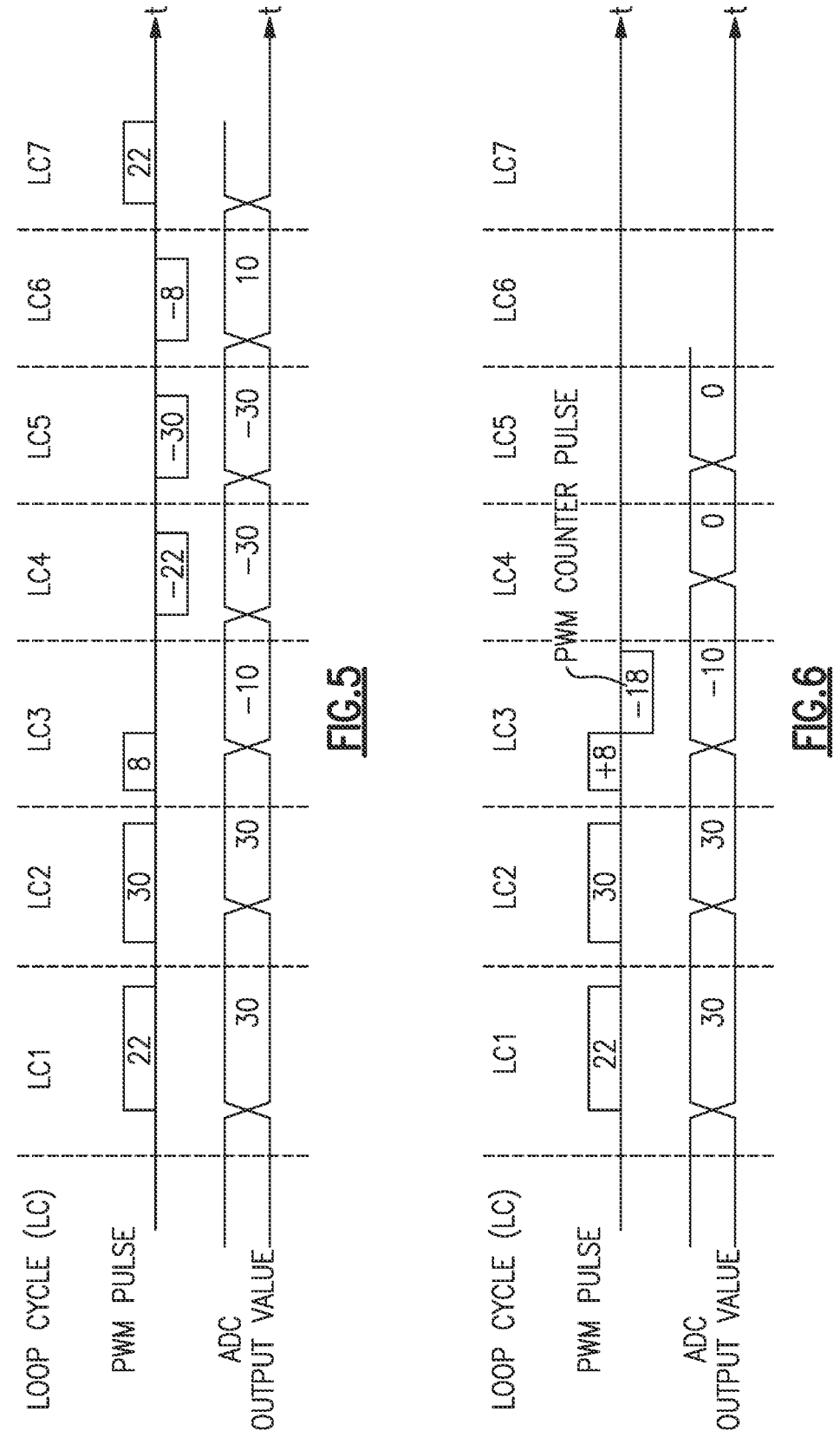
FIG. 5 is an exemplary signal diagram for illustrating a loop instability of a PWM control loop caused by PWM prediction.
FIG. 6 is a signal diagram for illustrating a stabilization of a PWM control loop by generation of a counter PWM pulse.

FIG. 5 illustrates an example of a loop instability of the PWM control loop caused by a predictive start without the provision of PWM counter pulses. In the illustrated example, the loop cycles LCs are each thirty-two time units (32 TU) long. Further, the predictive start can begin as early as 1 time unit. The ADC value ADC-VAL output by the analog-to-digital converter 3 is received by the PWM controller 4 after nine time units (9 TU). At that time point, the actual pulse width requested by the analog-to-digital converter 3 is known to the PWM controller 4.

At this time, the PWM pulse can be extended in the illustrated example for up to twenty-two time units (22 TU) more for a total time duration or pulse width of up to thirty time units (30 TU). The illustrated limits are just exemplary and any of them can be different in different applications and use cases. The prediction of the pulse width of a PWM pulse of a loop cycle LC (n) is performed on the basis of the pulse width of the PWM pulse of the previous loop cycle LC (n−1). If the pulse width of the PWM pulse of the previous loop cycle LC(8n−1) is large then the generation of the PWM pulse of the next loop cycle LC (n) is started earlier by the pulse generator 4C.

The stabilization of the PWM control loop is explained in the following by a specific example in the context of FIGS. 5 and 6.

As illustrated in FIG. 5, there is a predictive start but no generation of PWM counter pulses. In the illustrated example, since no counter pulses with opposite polarity are generated, an instability of the PWM control loop is created.

During loop cycle LC1, the ADC request of the analog-to-digital converter 3, i.e., the ADC output value ADC_VAL, is in the illustrated example thirty (ADC-VAL=30), but since no predictive start happens, the PWM pulse is only twenty-two time units (22 TU) long as illustrated in FIG. 5. This error builds up a ringing in the loop filter 2 of the PWM control loop.

During a second loop cycle LC2, the ADC request of the analog-to-digital converter 3 is again for a pulse width of thirty (ADC-VAL=30), and since predictive start started the PWM pulse at time unit one (TU1), when the request of the ADC 3 for the ADC value 30 is seen at the PWM controller 4 at nine time units (9 TU), a full pulse width of the PWM pulse lasting thirty time units (30 TU) can be generated in the second loop cycle LC2 by the PWM controller 4 as shown in FIG. 5.

In the illustrated example of FIG. 5, during the third loop cycle LC3, the ADC request, i.e., the ADC output value ADC_VAL, is minus ten (ADC_VAL=−10) which is the ringing from the error in pulse during the first loop cycle LC1. In the illustrated example, the predictive start has put out in the third loop cycle LC3 a PWM pulse having a width of eight time units (8 TU) but since minus ten (−10) as an output ADC value ADC-VAL is requested by the analog-to-digital converter 3, there is another error to keep the PWM control loop ringing.

During the fourth loop cycle LC4, the ADC request of the analog-to-digital converter 3 is for a PWM pulse corresponding to an ADC output value of minus thirty (ADC-VAL=−30), due to the error of the previous loop cycle LC3, but since no predictive start is applied, only a PWM pulse −22 can be generated as illustrated in FIG. 5. During a fifth loop cycle LC5, the ADC request for −30 is met due to predictive start, however, the PWM control loop is still ringing due to the error on the previous loop cycles. During a sixth loop cycle LC6, the ADC request (AD_VAL) is for a positive PWM pulse having a width of ten time units (10 TU), but the PWM pulse −8 has been generated by the predictive start, so another error does occur. During a seventh loop cycle LC7, the PWM control loop is back in the same state as in the first loop cycle LC1. Consequently, the ringing continues at a loop cycle period LCP comprising six loop cycles LCs (LCP=6).

FIG. 6 shows a timing diagram where the loop instability of the PWM control as described in context with FIG. 5 is avoided.

Similar to FIG. 5, the analog-to-digital converter ADC 3 provides an output value or ADC code 30 for the first loop cycles LC1, LC2. In contrast to FIG. 5, in a third loop cycle LC3 when the analog-to-digital converter 3 outputs a request for an output value of minus ten (−10) after the predictive start has generated a PWM pulse with a width of plus eight (+8), the system flips polarity and generates in the illustrated example a PWM counter pulse (PWM_COUNTER PULSE) with negative polarity (−) and a duration of eighteen time units (TU=18) which does clear out the cutoff PWM pulse with a positive polarity (+) and a duration of eight time units (TU=8) and leaves a net energy of minus ten energy units (−10) of both pulses corresponding to the ADC output value ADC-VAL supplied by the analog-to-digital converter 3 to the PWM controller 4 in the respective third loop cycle LC3. As illustrated in FIG. 6, this causes the PWM control loop to end up in a stable state.

The generated PWM counter pulses comprise an opposite polarity as illustrated in the example of FIG. 6. In the embodiment shown in FIG. 6, the PWM controller 4 generates a single counter PWM pulse such that the net pulse energy of the cutoff pulse (+8) and of the pulse energy of the generated counter PWM pulse (−18) corresponds to the pulse energy for generating the ADC value (−10) output by the analog-to-digital converter 3 of the PWM control loop during the respective loop cycle, i.e., during the third loop cycle LC3 in the illustrated example of FIG. 6.

In the illustrated example of FIG. 6, in the third loop cycle LC3 the amplitude of the PWM pulse and of the counter PWM pulse with opposite polarity is equal and comprises an amplitude unit AU. In an alternative embodiment, the amplitude of the PWM pulse and of the PWM counter pulse may differ. For instance, the amplitude of the negative counter pulse illustrated in FIG. 6 may be twice as high as the amplitude of the positive PWM pulse+8. In this case, the PWM controller 4 can generate a negative PWM pulse having eighteen energy units (18 EU) during nine time units (9 TU) of twice the amplitude (2 AU) such that the total area (integral) under the pulse curve of the PWM pulse representing the energy E of the PWM-pulse comprises eighteen energy units EU (2 AU*9 TU=18 EU).

In an embodiment, the predictive start comprises a multiplier on the peak of the last pulses. For example, it does start early enough to generate a pulse 4/3 the size of the largest of the two previous PWM pulses. For instance, if the previous pulse has a width of eighteen time units (18 TU), then the predictive start can begin two time units early to allow a PWM pulse having a pulse width of up to twenty-four time units (24 TU) (4/3 of 18 TU) to be generated with the addition of twenty two time units (22 TU) once the ADC value ADC-VAL offered by the analog-to-digital converter 3 is available. If the previous PWM pulse has twenty-three time units (23 TU), then the full eight time units (8 TU) of the predictive start can be used to allow a pulse of up to thirty time units (30 TU) to be generated by the PWM controller 4. In one implementation, the multiplication factor from previous pulse energy to prediction width is a register setting of a register. The H-bridge driver 7 controlled by the PWM controller 4 is adapted to generate a PWM counter pulse of opposite polarity until the resulting combination of PWM pulses meets the correct energy value triggered by the PWM control loop of the class D amplifier 1. This results in a stabilization of the PWM control loop. In this way, unwanted oscillation of the PWM control loop within the class D amplifier 1 can be avoided.

Figure 7:
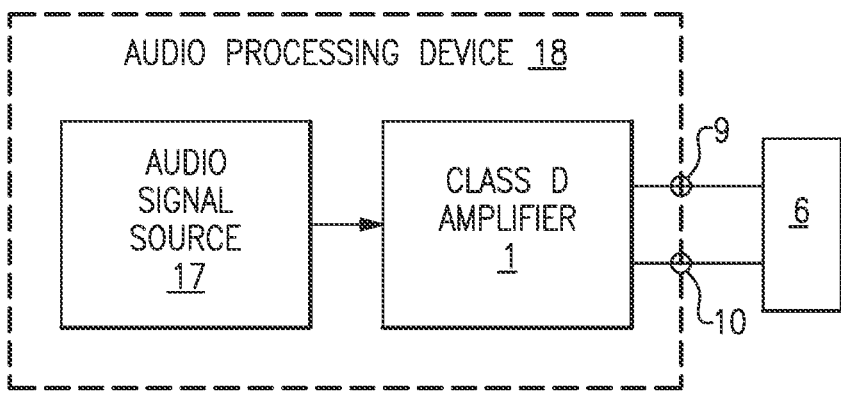
FIG. 7 is a schematic diagram of an audio processing device including a class D amplifier according to yet another embodiment.

FIG. 7 shows an audio processing device 18 comprising an audio signal source 17 adapted to generate an audio signal amplified by a class D amplifier 1 of the audio processing device 18. The class D amplifier 1 comprises a PWM controller 4 having a PWM pulse generator 4C adapted to generate in response to an ADC value output by an analog-to-digital converter 3 of the PWM control loop PWM pulses supplied to a H-bridge driver 7 of the class D amplifier 1. A comparator 4E is adapted to trigger a cutoff of a PWM pulse generated by the PWM pulse generator 4C of the PWM controller 4 during a loop cycle LC of the PWM control loop and to trigger the generation of at least one counter PWM pulse with an opposite polarity in the respective loop cycle LC such that the net pulse energy of the cutoff PWM pulse and of the at least one generated counter PWM pulse corresponds to a pulse energy representing the ADC value by the analog-to-digital converter 3 of the PWM control loop during the respective loop cycle LC. A loudspeaker 6, for example a loudspeaker of a wireless device which the audio processing device 18 is part of, can be connected to terminals 9, 10 of the signal output of the class D amplifier 1. In a possible embodiment, the audio signal source 18 can generate a digital audio stream supplied to an Audio DAC DEM 11 of the class D amplifier 1 as shown in FIG. 2.

The class D amplifier 1 can form part of an audio equipment or of electronic devices, in particular audio processing devices.

Examples of the electronic devices can include, but are not limited to, consumer electronic products, audio devices, parts of the consumer electronic products, electronic test equipment, etc. Examples of the electronic devices can also include, but are not limited to, memory chips, memory modules, or other communication networks, and disk driver circuits. The consumer electronic products or audio devices can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A class D amplifier comprising:
a pulse width modulation (PWM) control loop;
an H-bridge driver;
a PWM controller having a PWM pulse generator to generate PWM pulses supplied to the H-bridge driver in response to an ADC value output by an analog-to-digital converter of the PWM control loop; and
a comparator to trigger a cutoff of a PWM pulse generated by the PWM pulse generator of the PWM controller during a respective loop cycle of the PWM control loop and to trigger generation of at least one counter PWM pulse with an opposite polarity in the respective loop cycle such that a net pulse energy of the cutoff PWM pulse and of the at least one generated counter PWM pulse corresponds to a pulse energy representing the ADC value provided by the analog-to-digital converter of the PWM control loop during the respective loop cycle.

2. The class D amplifier according to claim 1 wherein the comparator is integrated in the PWM controller of the PWM control loop.

3. The class D amplifier according to claim 1 wherein the PWM control loop includes a loop filter to integrate an error between an input voltage which corresponds to an input audio signal and a voltage across a loudspeaker connected to the H-bridge driver of the class D amplifier.

4. The class D amplifier according to claim 3 wherein the analog-to-digital converter digitizes the integrated error every loop cycle of the PWM control loop of the class D amplifier to provide the ADC value output to the PWM controller.

5. The class D amplifier according to claim 4 wherein the PWM pulse generator generates PWM pulses supplied to the H-bridge driver of the class D amplifier in a normal operation mode in response to the digitized integrated error values received as ADC values from the analog-to-digital converter.

6. The class D amplifier according to claim 3 wherein the loop filter include an analog low-pass filter.

7. The class D amplifier according to claim 1 wherein the analog-to-digital converter supplies a digitized integrated error value as the ADC value every sample period of a digital input of the PWM controller.

8. The class D amplifier according to claim 1 wherein the PWM controller includes a supply voltage monitoring and prediction circuit adapted to maintain a target voltage.

9. The class D amplifier according to claim 1 wherein the PWM controller includes a common mode control circuit adapted to maintain a setpoint common mode voltage.

10. The class D amplifier according to claim 1 wherein the H-bridge driver includes a positive H-bridge driver circuit having a positive output terminal and a negative H-bridge driver circuit having a negative output terminal.

11. The class D amplifier according to claim 1 wherein the PWM pulse generator of the PWM controller supplies a first gray-coded output value to a positive H-bridge driver circuit of the H-bridge driver and a second gray-coded output value to a negative H-bridge driver circuit of the H-bridge driver of the class D amplifier.

12. The class D amplifier according to claim 1 wherein the digitized integrated error value supplied by the analog-to-digital converter to the digital input of the PWM controller comprises the ADC value with an offset binary format.

13. The class D amplifier according to claim 1 wherein the analog-to-digital converter comprises a SAR analog-to-digital converter.

14. A method for stabilizing a PWM control loop, the method comprising:

cutting off a PWM pulse generated by a PWM pulse generator of a PWM controller during a respective loop cycle of the PWM control loop; and generating at least one counter PWM pulse with an opposite polarity in the respective loop cycle such that the net pulse energy of the cutoff PWM pulse and of the at least one generated counter PWM pulse corresponds to a pulse energy representing an ADC value output by an analog-to-digital converter of the PWM control loop during the respective loop cycle.

15. The method according to claim 14 further comprising:

comparing a pulse energy of a PWM pulse representing the ADC value output by the analog-to-digital converter of the PWM control loop during the respective loop cycle of the PWM control loop with a pulse energy of a PWM pulse generated by a PWM pulse generator of the PWM controller of the PWM control loop during the respective loop cycle; and cutting off the PWM pulse generated by the PWM pulse generator of the PWM controller during the respective loop cycle and generating the at least one counter PWM pulse with an opposite polarity in the respective loop cycle such that a net pulse energy comprising the pulse energy of the cutoff PWM pulse and the pulse energy of the at least one generated counter PWM pulse corresponds to a pulse energy representing the ADC value output by the analog-to-digital converter during the respective loop cycle if the pulse energy of the PWM pulse generated by the PWM pulse generator during the respective loop cycle exceeds the pulse energy of the PWM pulse representing the ADC value output by the analog-to-digital converter during the respective loop cycle.

16. The method according to claim 14 wherein an amplitude of the counter PWM pulse is a multiple of the amplitude of the generated PWM pulse.

17. An audio processing device comprising a class D amplifier, the class D amplifier comprising:

a pulse width modulation (PWM) control loop including an analog-to-digital converter;

an H-bridge driver;

a PWM controller including a PWM pulse generator to generate PWM pulses supplied to the H-bridge driver in response to an ADC value output by the analog-to-digital converter of the PWM control loop; and a comparator to trigger a cutoff of a PWM pulse generated by the PWM pulse generator of the PWM controller during a respective loop cycle of the PWM control loop and to trigger the generation of at least one counter PWM pulse with an opposite polarity in the respective loop cycle such that the net pulse energy of the cutoff PWM pulse and of the at least one generated counter PWM pulse corresponds to a pulse energy representing the ADC value provided by the analog-to-digital converter of the PWM control loop during the respective loop cycle.

18. The audio processing device according to claim 17 wherein the PWM control loop includes a loop filter to integrate an error between an input voltage which corresponds to an input audio signal and a voltage across a loudspeaker connected to the H-bridge driver of the class D amplifier, and wherein the analog-to-digital converter digitizes the integrated error every loop cycle of the PWM control loop of the class D amplifier to provide the ADC value output to the PWM controller.

19. The audio processing device according to claim 18 wherein the PWM pulse generator generates PWM pulses supplied to the H-bridge driver of the class D amplifier in a normal operation mode in response to the digitized integrated error values received as ADC values from the analog-to-digital converter.

20. The audio processing device according to claim 17 wherein the PWM pulse generator of the PWM controller supplies a first gray-coded output value to a positive H-bridge driver circuit of the H-bridge driver and a second gray-coded output value to a negative H-bridge driver circuit of the H-bridge driver of the class D amplifier, wherein the digitized integrated error value supplied by the analog-to-digital converter to the digital input of the PWM controller includes the ADC value with an offset binary format, and wherein the analog-to-digital converter includes a SAR analog-to-digital converter.

* * * * *